(12) United States Patent
Lee

(10) Patent No.: US 9,477,439 B2
(45) Date of Patent: Oct. 25, 2016

(54) DEVICE AND METHOD FOR TERMINATING MUSIC REPRODUCTION IN A WIRELESS TERMINAL

(71) Applicant: Samsung Electronics Co., Ltd., Gyeonggi-do (KR)

(72) Inventor: Su-Jung Lee, Gyeonggi-do (KR)

(73) Assignee: Samsung Electronics Co., Ltd., Yeongtong-gu, Suwon-si, Gyeonggi-do (KR)

( * ) Notice: Subject to any disclaimer, the term of this patent is extended or adjusted under 35 U.S.C. 154(b) by 419 days.

(21) Appl. No.: 13/653,626

(22) Filed: Oct. 17, 2012

(65) Prior Publication Data

US 2013/0166054 A1  Jun. 27, 2013

(30) Foreign Application Priority Data

Dec. 21, 2011  (KR) .......................... 10-2011-0139113

(51) Int. Cl.

| G06F 17/00 | (2006.01) |
|---|---|
| G06F 3/16 | (2006.01) |
| H03G 3/20 | (2006.01) |
| H04M 1/725 | (2006.01) |
| G10H 1/00 | (2006.01) |
| G10H 1/46 | (2006.01) |
| H04M 1/67 | (2006.01) |

(52) U.S. Cl.
CPC ............ *G06F 3/165* (2013.01); *G10H 1/0083* (2013.01); *G10H 1/46* (2013.01); *H03G 3/20* (2013.01); *H04M 1/72558* (2013.01); *G10H 2240/251* (2013.01); *H04M 1/67* (2013.01); *H04S 2400/13* (2013.01)

(58) Field of Classification Search
CPC .......... H04M 1/7258; H04M 1/72558; H04R 29/00; H04S 2400/13; H03G 3/20; H03G 3/26; H03G 3/34; G06F 3/165
USPC ....... 700/94; 381/56, 61, 101-109; 455/3.06
See application file for complete search history.

(56) References Cited

U.S. PATENT DOCUMENTS

| 2004/0072589 | A1* | 4/2004 | Hamamura et al. ........ 455/550.1 |
| 2006/0009868 | A1* | 1/2006 | Park ................................. 700/94 |
| 2007/0021152 | A1* | 1/2007 | Jung .............................. 455/564 |
| 2007/0135091 | A1* | 6/2007 | Wassingbo .................... 455/410 |

(Continued)

FOREIGN PATENT DOCUMENTS

| CN | 1968472 A | 5/2007 |
| CN | 101834929 A | 9/2010 |

(Continued)

OTHER PUBLICATIONS

XP055143465, Next Track AndroLid by EP Dev: Media & Video, Sep. 9, 2011, pp. 1-3, http://www.androlib.com/android.application.com-epdev-nexttrack . . . .

(Continued)

*Primary Examiner* — Andrew C Flanders
(74) *Attorney, Agent, or Firm* — Cha & Reiter, LLC

(57) ABSTRACT

The present invention relates to a device and a method for terminating music reproduction in a wireless terminal. The device includes a key input unit including at least one specific key for terminating reproduced music; and a controller for controlling termination of the reproduced music when an input of the specific key is maintained for at least a predetermined amount of time.

10 Claims, 2 Drawing Sheets

(56) References Cited

U.S. PATENT DOCUMENTS

| | | |
|---|---|---|
| 2007/0186758 A1 | 8/2007 | Kim et al. |
| 2007/0271513 A1* | 11/2007 | Andren .................. 715/703 |
| 2008/0039072 A1* | 2/2008 | Bloebaum ................ 455/425 |
| 2008/0249643 A1* | 10/2008 | Nelson ..................... 700/94 |
| 2008/0319562 A1* | 12/2008 | Forstall .................... 700/94 |
| 2010/0235661 A1 | 9/2010 | Lu et al. |
| 2013/0006404 A1* | 1/2013 | Pitkanen et al. ........... 700/94 |

FOREIGN PATENT DOCUMENTS

| | | |
|---|---|---|
| KR | 10-0703455 B1 | 3/2007 |
| KR | 10-2011-0079384 A | 7/2011 |

OTHER PUBLICATIONS

Chinese Search Report, dated Aug. 25, 2016.

\* cited by examiner

DEVICE AND METHOD FOR TERMINATING MUSIC REPRODUCTION IN A WIRELESS TERMINAL

CLAIM OF PRIORITY

This application claims, pursuant to 35 USC §119(a), priority to, and the benefit of the earlier filing date of, that patent application entitled "Device And Method For Terminating Music Reproduction In Wireless Terminal" filed in the Korean Industrial Property Office on Dec. 21, 2011 and assigned Serial No. 10-2011-0139113, the contents of which are hereby incorporated by reference.

BACKGROUND OF THE INVENTION

1. Field of the Invention

The present invention relates to the field of wireless devices and more particularly, to a device and a method for terminating music reproduction in a wireless terminal.

2. Description of the Related Art

As wireless terminals (e.g., cellular telephones, tablets, netbooks, ultra=books, etc.) have changed from simple voice communications to complex internet access devices as the wireless networks have increased their capabilities, reliability and performance.

As wireless terminals have increased their functionality, (e.g., including a music player function), they also have been adapted to contain large-capacity memory for storage of musical tracks.

Further, the wireless terminal that can implement multi-processing can perform other applications while reproducing music as a background task.

However, in specific situations in which a user intends to terminate a music reproduction, the user needs to perform several input task so as to terminate the reproduced music.

For example, to terminate the music reproduction when the wireless terminal is in a locked state, the user needs to first depress a home key or a power key to activate a turned-off display unit, and input a pattern or a password for releasing the locked state of the wireless terminal. After the wireless terminal has been released from the locked state, and switched to a standby mode, the music may be stopped by selecting a music application that is being currently executed.

Thus, in order to terminate music being reproduced as a background task, when the display unit is in an inactive or locked state, the user needs to execute four processes, including activating the display, entering a password, recalling the music reproduction application and then terminating the music reproduction.

SUMMARY OF THE INVENTION

Accordingly, an aspect of the present invention is to solve the above-mentioned problems occurring in the prior art, and to provide a device and a method for conveniently terminating music being reproduced in the wireless terminal.

Another aspect of the present invention is to provide a device and a method for conveniently terminating music being reproduced as a background task regardless of a current operating mode of the wireless terminal.

Still another aspect of the present invention is to provide a device and a method for conveniently terminating music applications that are being executed as a background task regardless of a current operating mode of the wireless terminal.

In accordance with an aspect of the present invention, there is provided a device for terminating music reproduction in a wireless terminal, comprising a key input unit including at least one specific key terminating reproduced music and a controller terminating the reproduced music when an input of at least one of the least one specific key is maintained for at least a predetermined amount of time.

In accordance with another aspect of the present invention, there is provided a method for terminating music reproduction in a wireless terminal, comprising: reproducing music; and terminating the reproduced music when an input of at least one of a specific key is maintained for at least a predetermined time during the music reproduction.

In accordance with another aspect of the present invention, there is provided a device comprising a key input unit and a processor in communication with a memory, the memory including code which when accessed by the processor causes the processor to monitor an input from the key input unit, responsive to an input from the key input unit associated with a specific key, adjusting a volume of a music item being reproduced, determine whether the input from the key input unit is maintained for a predetermined amount of time and terminate an application associated with the music item being reproduced when the input from the key input unit is determined to be maintained for the predetermined amount of time.

BRIEF DESCRIPTION OF THE DRAWINGS

The above and other aspects, features and advantages of the present invention will be more apparent from the following detailed description taken in conjunction with the accompanying drawings, in which.

DETAILED DESCRIPTION OF THE INVENTION

Figure 1:
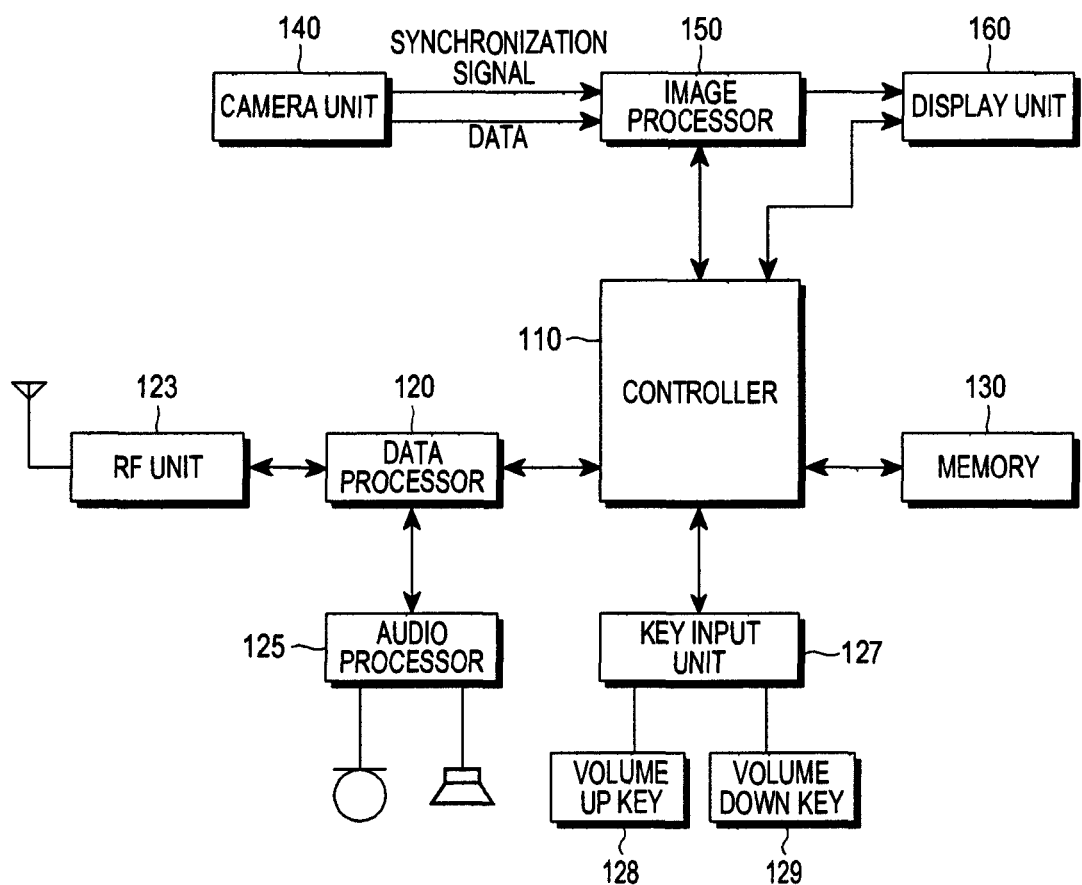
FIG. 1 illustrates a wireless terminal.

Exemplary embodiments of the present invention are described with reference to the accompanying drawings. In the following description, the same elements will be designated by the same reference numerals although they are shown in different drawings. In the following description, well-known functions or constructions are not described in detail since they would obscure the invention in unnecessary detail.

Also, terms described herein, which are defined considering the functions of the present invention, may be implemented differently depending on a user's and operator's intention and practice. Therefore, the terms should be understood on the basis of the disclosure throughout the specification. The principles and features of this invention may be employed in varied and numerous embodiments without departing from the scope of the invention.

Furthermore, although the drawings represent exemplary embodiments of the invention, the drawings are not necessarily to scale and certain features may be exaggerated or omitted in order to more clearly illustrate and explain the present invention.

Among the terms set forth herein, a portable terminal (or terminal) refers to any kind of device capable of processing data that is transmitted or received to, or from, an external entity or device. The terminal may display icons or menus on a screen to which stored data and various executable functions are assigned or mapped. The terminal may represent a computer, a notebook, a tablet PC, a mobile device, and the like.

FIG. 1 shows a configuration of a wireless terminal according to an exemplary embodiment of the present invention.

Referring to FIG. 1, an RF unit 123 performs a wireless communication function of a wireless terminal. The RF unit 123 may include an RF transmitter (not shown) for up-converting and amplifying a frequency of a transmitted signal, an RF receiver (not shown) for low-noise amplifying and down-converting a received signal, and the like. A data processor 120 may include a transmitter (not shown) for encoding and modulating the transmitted signal, a receiver (not shown) for demodulating and decoding the received signal, and the like. That is, the data processor 120 may be configured with a modem (modulator/demodulator) and a codec (coder/decoder). In this configuration, the codec may include a data codec for processing packet data and an audio codec for processing audio signals, such as voice data. An audio processor 125 serves to reproduce the received audio signals output from the audio codec of the data processor 120 or to transmit the audio signals generated from a microphone to the audio codec of the data processor 120.

A key input unit 127 may include keys for inputting alphanumeric information and function keys for setting various keys.

Further, the key input unit 127 may include at least one specific key that can terminate music reproduction. For example, the at least one specific key may be represented by the volume control keys that provide for controlling a volume of the wireless device. In a convention wireless transmission device, such as a cellular telephone, the volume control keys (one for increasing volume 128 and a second for decreasing volume 129) may be keys that are positioned along a side of the wireless device. In another aspect of the invention, the specific key may be a specific key that has been designated to be a music reproduction termination key when music reproduction is in progress. For example, a power-on key (not shown) may represent a music termination key when the wireless terminal is performing a music reproduction task.

Memory 130 may include a program memory (not shown) and a data memory (not shown). The program memory may store programs for controlling a general operation of the wireless terminal. In addition, according to the exemplary embodiment of the present invention, the program memory may store programs for controlling the termination of music reproduction when the input of a specific key is maintained for at least a predetermined amount of time. Further, the data memory serves to temporarily store data generated during the execution of the programs.

A controller 110 serves to control a general operation of the wireless terminal.

According to the exemplary embodiment of the present invention, the controller 110 may control the termination of music reproduction when the specific key is input for at least a predetermined amount of time during reproduction of music in the wireless terminal.

Further, according to an exemplary embodiment of the present invention, the controller 110 controls the termination of the music being reproduced as a background task when the input of one or more of the specific keys, (e.g., the volume control keys) is maintained for at least at least a predetermined time when the wireless terminal is in the locked state.

For example, according to the exemplary embodiment of the present invention, the controller 110 controls termination of music being reproduced as a background task when an input of the volume down key is continuously maintained for at least a predetermined amount time, in the case the volume down key is designated as the specific key for music reproduction termination. That is, when the wireless terminal is in a locked state and the volume control down key is input for at least a predetermined time, the volume is reduced to a "0" state and the music reproduction is subsequently terminated.

As would be recognized, termination of the music being reproduced may involve termination of a music reproduction application that is being performed as a background task in the wireless terminal.

In addition according to the exemplary embodiment of the present invention, the controller 110 controls termination of the music being reproduced as a background task when the wireless terminal is in a standby mode or a specific applications mode and the input of the specific key(s), (e.g., the volume control down key) is maintained for at least a predetermined amount of time.

Further, according to the exemplary embodiment of the present invention, the controller 110 controls termination of the music being reproduced as a background task when the input of the volume down key is continuously maintained for at least a predetermined time, in the case that the volume down key of the specific key. Alternatively, when one or more of the volume control keys of the wireless terminal is input for at least a predetermined time, when the wireless terminal is in a standby mode or the specific applications mode of the wireless terminal, then the volume level may be reduced to a "0" state and the music reproduction is terminated.

Thus, according to the exemplary embodiment of the present invention, the controller 110 controls termination of a music application being used to reproduce the music as a background task when the input of the specific key(s) is maintained for at least a predetermined amount of time.

The camera unit 140 may include a camera sensor for photographing image data and converting photographed image data into electrical signals and a signal processor converting image data signals photographed by the camera sensor into digital data. In this configuration, the camera sensor may be one of a CCD or a CMOS sensor and the signal processor may be implemented by a digital signal processor. Further, the camera sensor and the signal processor may be integrally implemented or separately implemented.

The image processor 150 performs image signal processing (ISP) for displaying the image signals output from the camera unit 140 on a display unit 160, wherein the ISP performs functions such as gamma calibration, interpolation, spatial variation, image effect, image scale, AWB, AE, AF, and the like. Therefore, the image processor 150 processes the image signals output from the camera unit 140 in a frame unit and outputs the frame image data in response to a feature and size of the display unit 160. Further, the image processor 150 includes a video codec and serves to compress the frame image data displayed on the display unit 160 in an established manner or reconstruct the compressed frame image data into original frame image data. Here, the video codec may be a JPEG codec, an MPEG4 codec, a Wavelet codec, or the like. The image processor 150 is assumed to include an on-screen display (OSD) function and may output on-screen display data according to a screen size displayed under the control of the controller 110.

The display unit 160 displays the image signal output from the image processor 150 on the screen and displays user data output from the controller 110. Herein, the display unit 160 may use an LCD, an LED or an OLED. In this case, the display unit 160 may include a display controller, a display memory storing the image data, an LCD (LED, OLED) display device, and the like (all of which are not shown). Herein, when the display unit may be implemented as a touch screen device and, thus, the display unit may be operated as an input unit. In this case, the display unit 160 may display keys similar to that of the key input unit 127, or the like. The display unit may operate as the sole input unit or may operate in conjunction with the key input unit 127.

In the above-mentioned wireless terminal, an operation of terminating music reproduction will be described with reference to FIG. 2.

Figure 2:
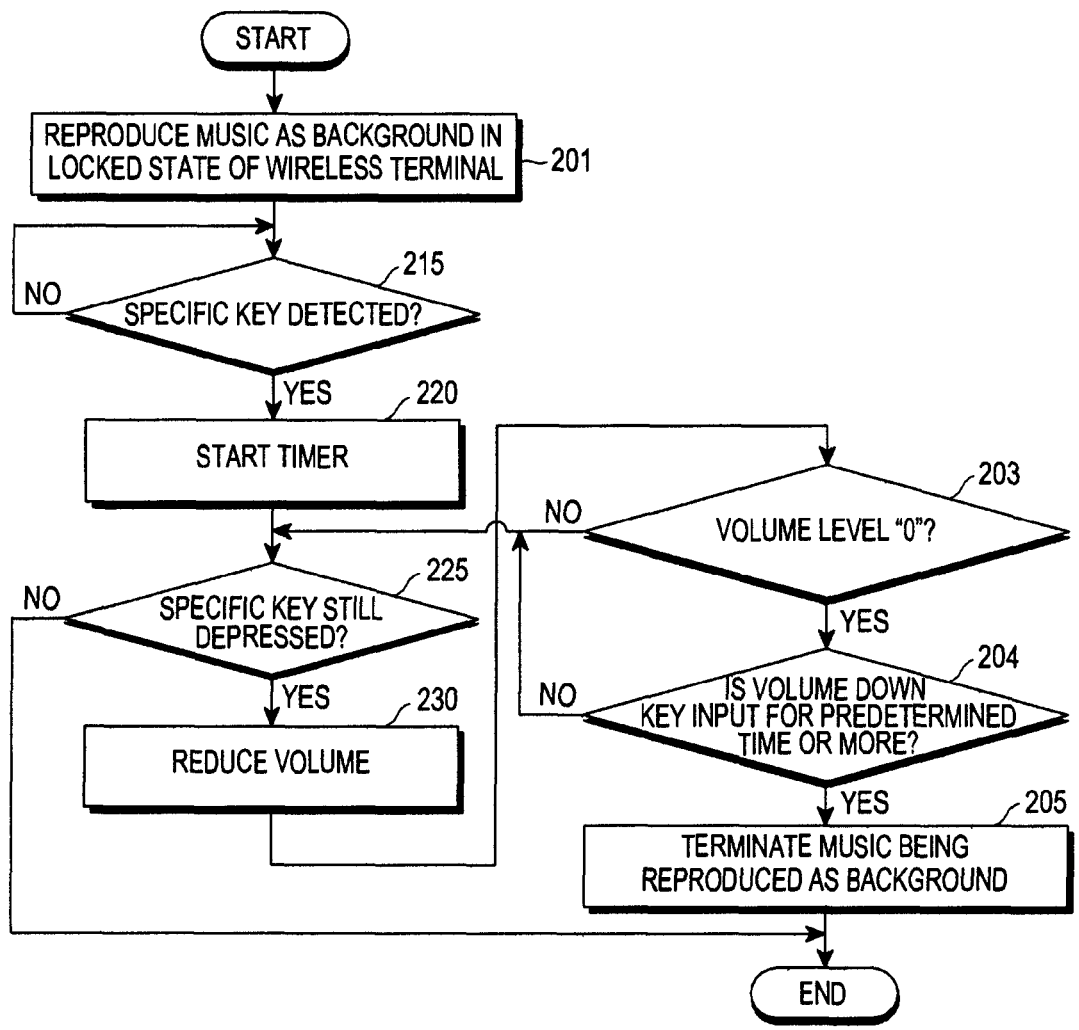
FIG. 2 is a flow chart illustrating a process of terminating music reproduction in the wireless terminal according to the exemplary embodiment of the present invention.

FIG. 2 is a flow chart showing a process of terminating music reproduction in the wireless terminal according to the exemplary embodiment of the present invention.

Referring to FIG. 2, at S201, the controller 110 switches the wireless terminal to a locked state and reproduces the music as a background task even though the wireless terminal is in a locked state.

At S215 a determination is made whether a specific key has been inputted (by being detected by a processor, for example). If the specific key is detected (for example, the specific key is a volume down key (129, FIG. 1), then a timer is started at block 220. At block 225, a determination is made whether the specific key is still depressed. If the answer is negative, then processing is ended.

However, if the specific key is determined to be still depressed, then the volume is reduced, in response to the volume down key, at S230.

At S203, a determination is made whether the volume level is reduced to "0." If the answer is negative, then processing continues to S225 to determine whether the specific key is still depressed. If yes, then volume is again reduced and processing continues to S203.

At S203, when the volume is determined to be at a "0" level, then a determination is made when the specific key (in this exemplary case, the volume down key 129) is input for a predetermined or more. If the answer is negative, then processing continues to S225 to determine whether the specific key (i.e., the volume down key 129) is still depressed.

However, if at S204, it is determined that the specific key has been depressed for the predetermined time or more, then the music being played as a background task is terminate.

At S205, the controller 110 does not temporarily stop the reproduced music but may terminate the music application, when the input of the volume down key is maintained for at least a predetermined amount of time and the volume level is in the "0" state.

As shown in FIG. 2, the embodiment of the present invention describes, by way of example, the case in which the music being reproduced as a background task is terminated through the input of a specific key when the wireless terminal is in a locked state. In addition, the controller 110 may terminate the music being reproduced as a background task through the input of a specific key, regardless of the current operation mode of the wireless terminal (i.e., a locked state, a standby mode or a specific application mode.)

Further, the exemplary embodiment of the present invention describes, by way of example, the case in which the music being reproduced as a background task is terminated through, for example, the input of the volume down key.

However, it would be recognized that the music being reproduced as a background task may be terminated even when a volume up key and a volume down key are simultaneously input (i.e., the predetermined time being a zero amount of time) or the volume up key and the volume down key are simultaneously input for at least the predetermined time.

The present invention provides a device and a method for terminating music reproduction in a wireless terminal, by which it is possible to conveniently terminate music being reproduced as a background task regardless of the current status of the wireless terminal and to reduce power consumption by terminating a music application.

The above-described methods according to the present invention can be implemented in hardware, firmware or as software or computer code that can be stored in a recording medium such as a CD ROM, an RAM, a floppy disk, a hard disk, or a magneto-optical disk or computer code downloaded over a network originally stored on a remote recording medium or a non-transitory machine readable medium and to be stored on a local recording medium, so that the methods described herein can be rendered in such software that is stored on the recording medium using a general purpose computer, or a special processor or in programmable or dedicated hardware, such as an ASIC or FPGA. As would be understood in the art, the computer, the processor, microprocessor controller or the programmable hardware include memory components, e.g., RAM, ROM, Flash, etc. that may store or receive software or computer code that when accessed and executed by the computer, processor or hardware implement the processing methods described herein. In addition, it would be recognized that when a general purpose computer accesses code for implementing the processing shown herein, the execution of the code transforms the general purpose computer into a special purpose computer for executing the processing shown herein.

While the invention has been shown and described with reference to certain exemplary embodiments thereof, it will be understood by those skilled in the art that various changes in form and details may be made therein without departing from the spirit and scope of the invention as defined by the appended claims.

What is claimed is:

1. A wireless terminal comprising:
a volume down key; and
a controller configured to:
determine whether the volume down key is pressed for at least a predetermined amount of time while a volume level of the wireless terminal is set to a lowest value,
terminate a reproduction of music if the volume down key is pressed for the at least a predetermined amount of time;
wherein the reproduction of music is terminated in response to the volume down key being activated while the wireless terminal is locked.

2. The wireless terminal of claim 1, wherein the reproduction of music is terminated in response to the volume down key being activated while the wireless terminal is in a standby mode or a predetermined application is being executed by the controller.

3. The wireless terminal of claim 1, wherein the reproduction of music is performed by executing a music application, and terminating the reproduction of music includes terminating the music application.

4. The wireless terminal of claim 1, wherein the reproduction of music is terminated when the volume down key and a volume up key are activated simultaneously for the predetermined amount of time.

5. A method comprising:
   initiating, by a wireless terminal, a reproduction of music, wherein a volume level of the reproduction of music is reduced when a volume down key of the wireless terminal is activated; determining whether the volume level is currently set to a lowest value in response to the volume down key being activated;
   determining whether the volume down key is pressed for at least a predetermined amount of time if the a volume level is set to the lowest value,
   terminating the reproduction of music if the volume down key is pressed for the at least a predetermined amount of time,
   wherein the reproduction of music is terminated in response to the volume down being activated while the wireless terminal is locked.

6. The method of claim 5, wherein the reproduction of music is terminated in response to the volume down key being activated while the wireless terminal is in a standby mode or a predetermined application is being executed by the wireless terminal.

7. The method of claim 5, wherein the lowest value is "0".

8. The method of claim 5, wherein the reproduction of music is performed by executing a music application, and terminating the reproduction of music includes terminating the music application.

9. The method of claim 5, wherein the reproduction of music is terminated when the volume down key and a volume up key are activated simultaneously.

10. The method of claim 5, wherein the reproduction of music is terminated when the volume down key and a volume up key are activated simultaneously for the predetermined amount of time.

* * * * *

UNITED STATES PATENT AND TRADEMARK OFFICE
CERTIFICATE OF CORRECTION

PATENT NO. : 9,477,439 B2
APPLICATION NO. : 13/653626
DATED : October 25, 2016
INVENTOR(S) : Su-Jung Lee Page 1 of 1

It is certified that error appears in the above-identified patent and that said Letters Patent is hereby corrected as shown below:

In the Claims

Column 6, Claim 1, Lines 55-56 should read as follows:
--...time, wherein the reproduction...--

Column 7, Claim 5, Line 13 should read as follows:
--...time if the volume...--

Column 7, Claim 5, Lines 14-15 should read as follows:
--...lowest value; and terminating...--

Signed and Sealed this
Sixth Day of December, 2016

Michelle K. Lee
*Director of the United States Patent and Trademark Office*